(12) United States Patent
Huang et al.

(10) Patent No.: US 9,778,526 B2
(45) Date of Patent: Oct. 3, 2017

(54) DISPLAY PANEL AND PIXEL ARRAY THEREOF

(71) Applicant: AU Optronics Corp., Hsin-Chu (TW)

(72) Inventors: Shiuan-Hua Huang, Hsin-Chu (TW); Jian-Hong Lin, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/047,650

(22) Filed: Feb. 19, 2016

(65) Prior Publication Data

US 2016/0370636 A1    Dec. 22, 2016

(30) Foreign Application Priority Data

Jun. 16, 2015    (TW) .............................. 104119373 A

(51) Int. Cl.
*G02F 1/1362*    (2006.01)
*G02F 1/1343*    (2006.01)
(Continued)

(52) U.S. Cl.
CPC ........ *G02F 1/13624* (2013.01); *G02F 1/1368* (2013.01); *G02F 1/134336* (2013.01);
(Continued)

(58) Field of Classification Search
CPC .......... G02F 1/134336; G02F 1/13624; G02F 1/136286; G02F 1/1368; H01L 27/1222;
(Continued)

(56) References Cited

U.S. PATENT DOCUMENTS

2007/0109482 A1*  5/2007  Kim ................... G02F 1/133707
                                                    349/144
2007/0126944 A1*  6/2007  Kim ................... G02F 1/136286
                                                    349/43
(Continued)

FOREIGN PATENT DOCUMENTS

CN    102237355 A    11/2011
TW    201445227      12/2014

OTHER PUBLICATIONS

State Intellectual Property Office of the P.R.C., Office Action:, dated Jul. 17, 2017.

*Primary Examiner* — Ryan Crockett
(74) *Attorney, Agent, or Firm* — Locke Lord LLP; Tim Tingkang Xia, Esq.

(57) ABSTRACT

A pixel array includes pixel rows. Each pixel row includes a first gate line, a second gate line, sub-pixels and data lines. Each data line includes a main portion, a branch portion and a connecting portion. The main portions of the data lines are arranged along a second direction in sequence. The branch portions and the main portions of the data lines are arranged alternately along the second direction in sequence, and each sub-pixel is disposed between any two of the adjoining main portion and branch portion. The connecting portion of each of the data lines is disposed between the first gate line and the second gate line, the connecting portion of each data line is electrically connected with the main portion and the branch portion of each data line, and the connecting portion of each data line penetrates through the corresponding sub-pixel along the second direction.

16 Claims, 8 Drawing Sheets

(51) Int. Cl.
*H01L 27/12* (2006.01)
*G02F 1/1368* (2006.01)
(52) U.S. Cl.
CPC .... *G02F 1/136286* (2013.01); *H01L 27/1222* (2013.01); *H01L 27/1225* (2013.01); *G02F 2001/134345* (2013.01); *H01L 27/124* (2013.01)
(58) Field of Classification Search
CPC .............. H01L 27/1225; H01L 27/124; G02F 2001/134345
See application file for complete search history.

(56) References Cited

U.S. PATENT DOCUMENTS

| | | | | |
|---|---|---|---|---|
| 2010/0302215 | A1* | 12/2010 | Tsai | G09G 3/3614 345/204 |
| 2011/0085100 | A1* | 4/2011 | Kim | G02F 1/134363 349/41 |
| 2011/0169018 | A1* | 7/2011 | Hsiao | G02F 1/1368 257/88 |
| 2013/0277691 | A1* | 10/2013 | Park | H01L 27/124 257/88 |
| 2014/0063390 | A1 | 3/2014 | Yonekura | |
| 2014/0347586 | A1* | 11/2014 | Wang | G02F 1/13394 349/43 |

* cited by examiner

DISPLAY PANEL AND PIXEL ARRAY THEREOF

BACKGROUND OF THE DISCLOSURE

1. Field of the Disclosure

The present disclosure generally relates to a display panel and a pixel array thereof, and more particularly, to a display panel and a pixel array with a half source driver (HSD) structure including connecting portions of data lines which penetrate through sub-pixels.

2. Description of the Prior Art

With the improvement in liquid crystal display (LCD) technique, liquid crystal display has been prevalently used in electronic products such as flat panel TVs, laptop PCs, and mobile phones. The driving method of a conventional liquid crystal display utilizes source drivers and gate drivers to drive pixels in a display panel, and the cost of the source driver is higher than that of the gate driver. In order to reduce the number of the source drivers used in the liquid crystal display, a display panel with a half source driver (HSD) structure has been developed. For the same number of pixels, the half source driver structure has half number of the data lines of the source drivers and doubled number of the gate lines of the gate drivers, so as to reduce the manufacturing cost. In a pixel array of a conventional display panel with the half source driver structure, the data line is electrically connected with the active switching element of the corresponding pixel. Therefore, the circuit layout area between two adjoining gate lines of two adjoining pixel rows cannot be reduced, and the open ratio of the pixel cannot be effectively enhanced.

SUMMARY OF THE DISCLOSURE

It is one of the objectives of the present disclosure to provide a display panel and a pixel array with a half source driver structure including connecting portions of data lines which penetrate through sub-pixels for enhancing the open ratio of the display panel.

To achieve the purposes described above, an embodiment of the present disclosure provides a pixel array disposed on an array substrate. The pixel array includes a plurality of pixel rows. Each of the pixel rows includes a first gate line, a second gate line, a plurality of sub-pixels and a plurality of data lines. The first gate line and the second gate line are arranged alternately along a first direction in sequence. The sub-pixels are disposed between the first gate line and the second gate line along a second direction, a portion of the sub-pixels are electrically connected with the first gate line, and the other portion of the sub-pixels are electrically connected with the second gate line. Each of the data lines includes a main portion, a branch portion and a connecting portion. The main portions of the data lines are arranged along the second direction in sequence, and the main portions of the data lines intersect the first gate line and the second gate line. The branch portions and the main portions of the data lines are arranged alternately along the second direction, and each of the sub-pixels is disposed between any two of the main portion and the branch portion adjoining to each other. The connecting portion of each of the data lines is disposed between the first gate line and the second gate line, the connecting portion of each of the data lines is electrically connected with the main portion and the branch portion, and the connecting portion of each of the data lines penetrates through the sub-pixel disposed between the main portion and the branch portion along the second direction.

To achieve the purposes described above, another embodiment of the present disclosure provides a display panel. The display panel includes the aforementioned pixel array, a counter substrate and a display medium layer. The counter substrate is disposed opposite to the array substrate, and the display medium layer is disposed between the array substrate and the counter substrate.

These and other objectives of the present disclosure will no doubt become obvious to those of ordinary skill in the art after reading the following detailed description of the preferred embodiment that is illustrated in the various figures and drawings.

DETAILED DESCRIPTION

To provide a better understanding of the present disclosure to the skilled persons in the technology of the present disclosure, preferred embodiments will be detailed as follows. The preferred embodiments of the present disclosure are illustrated in the accompanying drawings with numbered elements to elaborate the contents and effects to be achieved.

Figure 1:
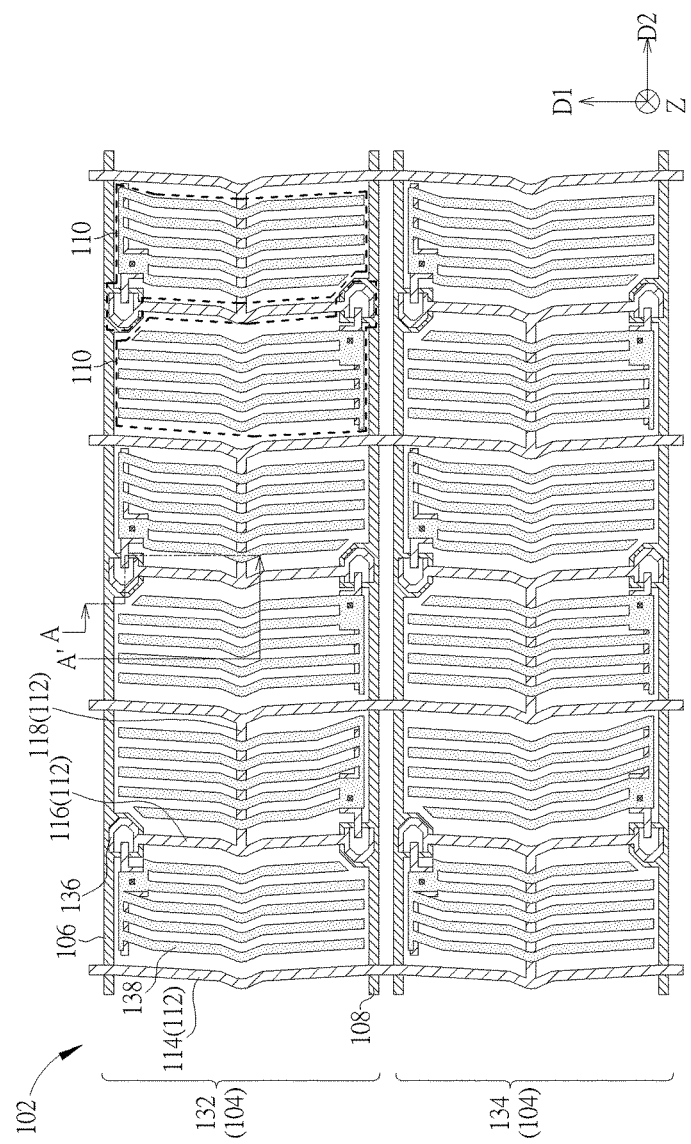
FIG. 1 is a schematic diagram illustrating a pixel array according to a first embodiment of the present disclosure.
Figure 2:
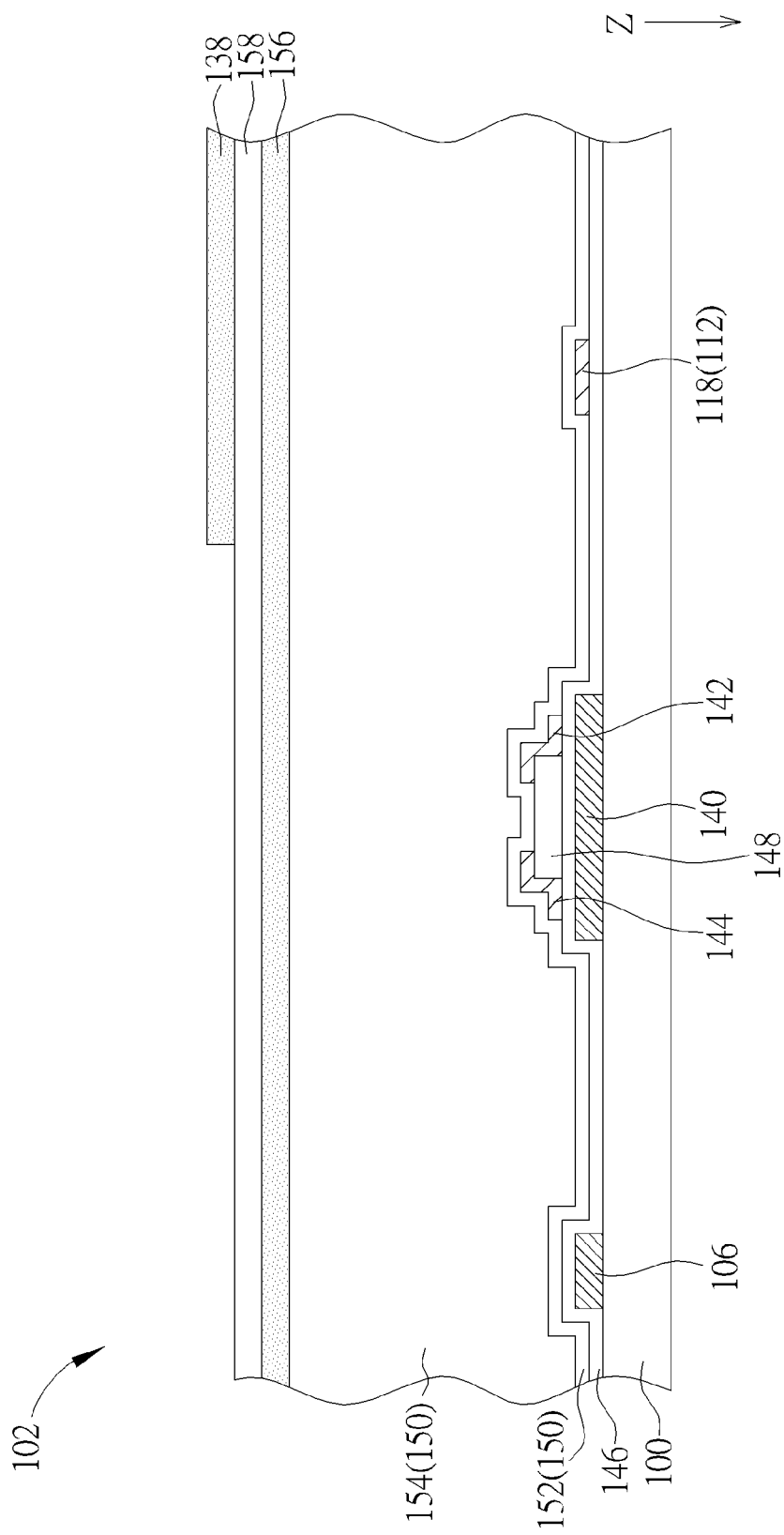
FIG. 2 is a schematic diagram illustrating a cross-sectional view of the pixel array taken along a line A-A' in FIG. 1.

Please refer to FIG. 1 and FIG. 2. FIG. 1 is a schematic diagram illustrating a pixel array according to a first embodiment of the present disclosure, and FIG. 2 is a schematic diagram illustrating a cross-sectional view of the pixel array taken along a line A-A' in FIG. 1. As shown in FIG. 1 and FIG. 2, a pixel array 102 of this embodiment is disposed on an array substrate 100. The pixel array 102 includes a plurality of pixel rows 104, and each of the pixel rows 104 includes a first gate line 106, a second gate line 108, a plurality of sub-pixels 110 and a plurality of data lines 112. The first gate line 106 and the second gate line 108 are arranged alternately along a first direction D1 in sequence. The sub-pixels 110 are disposed between the first gate line 106 and the second gate line 108 and arranged along a second direction D2, wherein a portion of the sub-pixels 110 are electrically connected with the first gate line 106, and the other portion of the sub-pixels 110 are electrically connected with the second gate line 108. In this embodiment, the first direction D1 is the longitudinal direction in FIG. 1, and the second direction D2 is the lateral direction in FIG. 1, but not limited thereto.

Each of the data lines 112 includes a main portion 114, a branch portion 116 and a connecting portion 118. The main portions 114 of the data lines 112 are arranged along the second direction D2 in sequence, and the main portions 114 of the data lines 112 intersect the first gate line 106 and the second gate line 108. Specifically, the main portions 114 of the data lines 112 partially overlap the first gate line 106 and the second gate line 108 in the vertical projection direction Z. The branch portions 116 and the main portions 114 of the data lines 112 are arranged alternately along the second direction D2, and each of the sub-pixels 110 is disposed between any two of the main portion 114 and the branch portion 116 adjoining to each other. The connecting portion 118 of each of the data lines 112 is disposed between the first gate line 106 and the second gate line 108, the connecting portion 118 of each of the data lines 112 is electrically connected with the main portion 114 and the branch portion 116, and the connecting portion 118 of each of the data lines 112 penetrates through the sub-pixel 110 disposed between the main portion 114 and the branch portion 116 along the second direction D2. Thus, the main portion 114, the branch portion 116 and the connecting portion 118 of each of the data lines 112 may form an H-shaped structure, but not limited thereto. In this embodiment, the connecting portion 118 of each of the data lines 112, the first gate line 106 and the second gate line 108 in each of the pixel rows 104 may be parallel to one another, and the main portion 114 and the branch portion 116 of each of the data lines 112 in each of the pixel rows 104 may be parallel to each other, but not limited thereto. In addition, the branch portions 116 of the data lines 112 in each of the pixel rows 104 are disposed between the first gate line 106 and the second gate line 108 of the same pixel row 104. The pixel array 102 of this embodiment is a pixel array with a half source driver structure, and therefore a portion of the sub-pixels share the same data lines, so as to reduce the number of the data lines in the pixel array. What's more, in the pixel array 102 of this embodiment, the connecting portion 118 of each of the data lines 112 is electrically connected with the branch portion 116 and the main portion 114 and penetrates through the sub-pixel 110. Therefore, the branch portions 116 of the data lines 112 in the pixel array 102 of this embodiment can be electrically connected with the active switching elements 136 of two adjoining sub-pixels 110 without requiring the circuit layout area between the first gate line 106 of one of the pixel rows 104 and the second gate line 108 of another one of the pixel rows 104 adjoining thereto. Accordingly, the circuit layout area between the first gate line 106 of one of the pixel rows 104 and the second gate line 108 of another one of the pixel rows 104 adjoining thereto can be effectively reduced for enhancing the open ratio of the display panel. It is noteworthy that the efficiency of the liquid crystal in the region located in the middle of each of the sub-pixels 110 of the pixel array 102 is lower than other regions in each of the sub-pixels 110, and the connecting portion 118 of each of the data lines 112 of this embodiment can block the region in each of the sub-pixels 110 where the efficiency of the liquid crystal is low for further enhancing the total efficiency of the display panel.

In the pixel array 102 of this embodiment, the main portion 114 and the branch portion 116 of each of the data lines 112 are both V-shaped (non-straight) electrodes, rotated by 90 degrees in clockwise, but not limited thereto. In a variant embodiment, the main portion 114 and the branch portion 116 of each of the data lines 112 may be straight electrodes extending along the same direction (such as the first direction D1). It is noteworthy that the pixel rows 104 of this embodiment can include a first pixel row 132 and a second pixel row 134. The connecting portions 118 of the data lines 112 of the first pixel row 132 penetrate even-numbered sub-pixels 110 of the first pixel row 132, and the connecting portions 118 of the data lines 112 of the second pixel row 134 penetrate odd-numbered sub-pixels 110 of the second pixel row 134, but not limited thereto. In a variant embodiment, the connecting portions 118 of the data lines 112 of the first pixel row 132 may penetrate odd-numbered sub-pixels 110 of the first pixel row 132, and the connecting portions 118 of the data lines 112 of the second pixel row 134 may penetrate even-numbered sub-pixels 110 of the second pixel row 134.

In this embodiment, each of the sub-pixels 110 includes an active switching element 136 and a pixel electrode 138, wherein the active switching element 136 includes a gate electrode 140, a drain electrode 142 and a source electrode 144, and the pixel electrode 138 is electrically connected with the drain electrode 142 of the corresponding active switching element 136. In addition, the branch portion 116 of each of the data lines 112 is electrically connected with the source electrodes 144 of the active switching elements 136 of two sub-pixels 110 which are adjoining to the branch portion 116 in the second direction D2. For example, an end of the branch portion 116 of each of the data lines 112 may be electrically connected with the source electrode 144 of the active switching element 136 of one of the sub-pixels 110 which is adjoining to the branch portion 116, and the other end of the branch portion 116 of each of the data lines 112 may be electrically connected with the source electrode 144 of the active switching element 136 of the other one of the sub-pixels 110 which is adjoining to the branch portion 116, but not limited thereto. Specifically, in each of the pixel rows 104, the gate electrodes 140 of the active switching elements 136 of $(6n-5)^{th}$ numbered sub-pixels 110, the gate electrodes 140 of the active switching elements 136 of $(6n-2)^{th}$ numbered sub-pixel 110 and the gate electrodes 140 of the active switching elements 136 of $(6n)^{th}$ numbered sub-pixel 110 are electrically connected with the first gate line 106; the gate electrodes 140 of the active switching elements 136 of $(6n-4)^{th}$ numbered sub-pixels 110, the gate electrodes 140 of the active switching elements 136 of $(6n-3)^{th}$ numbered sub-pixels 110 and the gate electrodes 140 of the active switching elements 136 of $(6n-1)^{th}$ numbered sub-pixels 110 are electrically connected with the second gate line 108, and n is a set of integers greater than 0, but not limited thereto. In addition, the sub-pixels 110 may include sub-pixels providing light with different colors which may be mixed to present a full color display effect. The sub-pixels 110 may include red sub-pixels, green sub-pixels and blue sub-pixels for instance, and red sub-pixels, green sub-pixels and blue sub-pixels may be arranged in stripe, but not limited thereto. For example, in each of the pixel rows 104, $(6n-5)^{th}$ and $(6n-2)^{th}$ numbered sub-pixels 110 may be blue sub-pixels, $(6n-4)^{th}$ and $(6n-1)^{th}$ numbered sub-pixels 110 may be red sub-pixels and $(6n-3)^{th}$ and $(6n)^{th}$ numbered sub-pixels 110 may be green sub-pixels, and therefore light with different colors provided by the sub-pixels 110 may be mixed to present a full color display effect, but not limited thereto. In a variant embodiment, in each of the pixel rows 104, $(6n-5)^{th}$ and $(6n-2)^{th}$ numbered sub-pixels 110 may be red sub-pixels, $(6n-4)^{th}$ and $(6n-1)^{th}$ numbered sub-pixels 110 may be green sub-pixels and $(6n-3)^{th}$ and $(6n)^{th}$ numbered sub-pixels 110 may be blue sub-pixels. It is noteworthy that the driving method of the column inversion may be employed to the pixel array 102 of this embodiment, but not limited thereto.

Please refer to FIG. 2 again. The active switching element 136 of this embodiment may be a thin film transistor, such as an amorphous silicon thin film transistor, an oxide semiconductor thin film transistor or other types of thin film transistors, and the thin film transistor may also be a top gate type thin film transistor, a bottom gate type thin film transistor or other types of thin film transistors. The active switching element 136 of this embodiment is a bottom gate type amorphous silicon thin film transistor which includes the gate electrode 140, the drain electrode 142, the source electrode 144, a gate insulating layer 146, a channel layer 148 and a passivation layer 150. The gate electrode 140 is disposed on the array substrate 100 and is electrically connected with the first gate line 106 or the second gate line 108. The gate insulating layer 146 is disposed on the gate electrode 140 and the array substrate 100. The channel layer 148 may be an amorphous silicon channel layer disposed on the gate insulating layer 146 for example, and the channel layer 148 may overlap the gate electrode 140 in the vertical projection direction Z. The material of the channel layer 148 is not limited to amorphous silicon and may be other suitable semiconductors. For example, the channel layer 148 may be a silicon layer such as a polycrystalline silicon layer or a microcrystalline silicon layer. In addition, the channel layer 148 may also be an oxide semiconductor layer such as an indium gallium zinc oxide (IGZO) layer, but not limited thereto. The drain electrode 142 and the source electrode 144 are disposed on the channel layer 148 and the gate insulating layer 146, and the source electrode 144 is electrically connected with the data line 112. The passivation layer 150 is disposed on the drain electrode 142, the source electrode 144, the channel layer 148 and the gate insulating layer 146. The passivation layer 150 may be a single-layered structure or a multi-layered structure. In this embodiment, the passivation layer 150 may be a double-layered structure. For example, a first passivation layer 152 and a second passivation layer 154 may stack in sequence to form the passivation layer 150 of this embodiment. The material of the first passivation layer 152 may be an inorganic insulating material such as silicon oxide, silicon nitride, silicon oxynitride or a combination thereof, but not limited thereto. The material of the second passivation layer 154 may be an organic insulating layer such as epoxy resin, acrylic or a combination thereof, but not limited thereto. The second passivation layer 154 may be disposed on the first passivation layer 152, and the thickness of the second passivation layer 154 may preferably be greater than the thickness of the first passivation layer 152, and the thickness of the second passivation layer 154 may preferably be 2 micrometers (μm), but not limited thereto. Moreover, the pixel array 102 of this embodiment further includes a common electrode 156, an insulating layer 158 and the pixel electrodes 138. The common electrode 156 is disposed on the passivation layer 150, the pixel electrodes 138 are disposed on the common electrode 156, and the insulating layer 158 is disposed between the common electrode 156 and the pixel electrodes 138, but not limited thereto. The pixel array 102 of this embodiment includes the passivation layer 150 which the thickness of the passivation layer 150 is about 2 micrometers, and therefore the parasitic capacitance between the data line 112 and the pixel electrode 138 can be effectively reduced. Furthermore, the pixel electrode 138 can be disposed to overlap the data line 112 in the vertical projection direction Z, the influence brought by the parasitic capacitance between the data line 112 and the pixel electrode 138 can be reduced, and the open ratio of the display panel can be effectively enhanced. In this embodiment, the first gate lines 106, the second gate lines 108 and the gate electrodes 140 may be formed by the same patterned metallic layer (such as a first metallic layer), but not limited thereto. The data lines 112, the source electrodes 144 and the drain electrodes 142 may be formed by the same patterned metallic layer (such as a second metallic layer), but not limited thereto. The pixel electrodes 138 may be transparent electrodes, such as indium tin oxide (ITO) electrodes, but not limited thereto.

The pixel array of the present disclosure is not limited to the above mentioned embodiment. The following description will detail the pixel array of other preferable embodiments. To simplify the description, identical components in each of the following embodiments are marked with identical symbols. For making it easier to understand the differences between the embodiments, the following description will detail the dissimilarities among different embodiments and the identical features will not be redundantly described.

Figure 3:
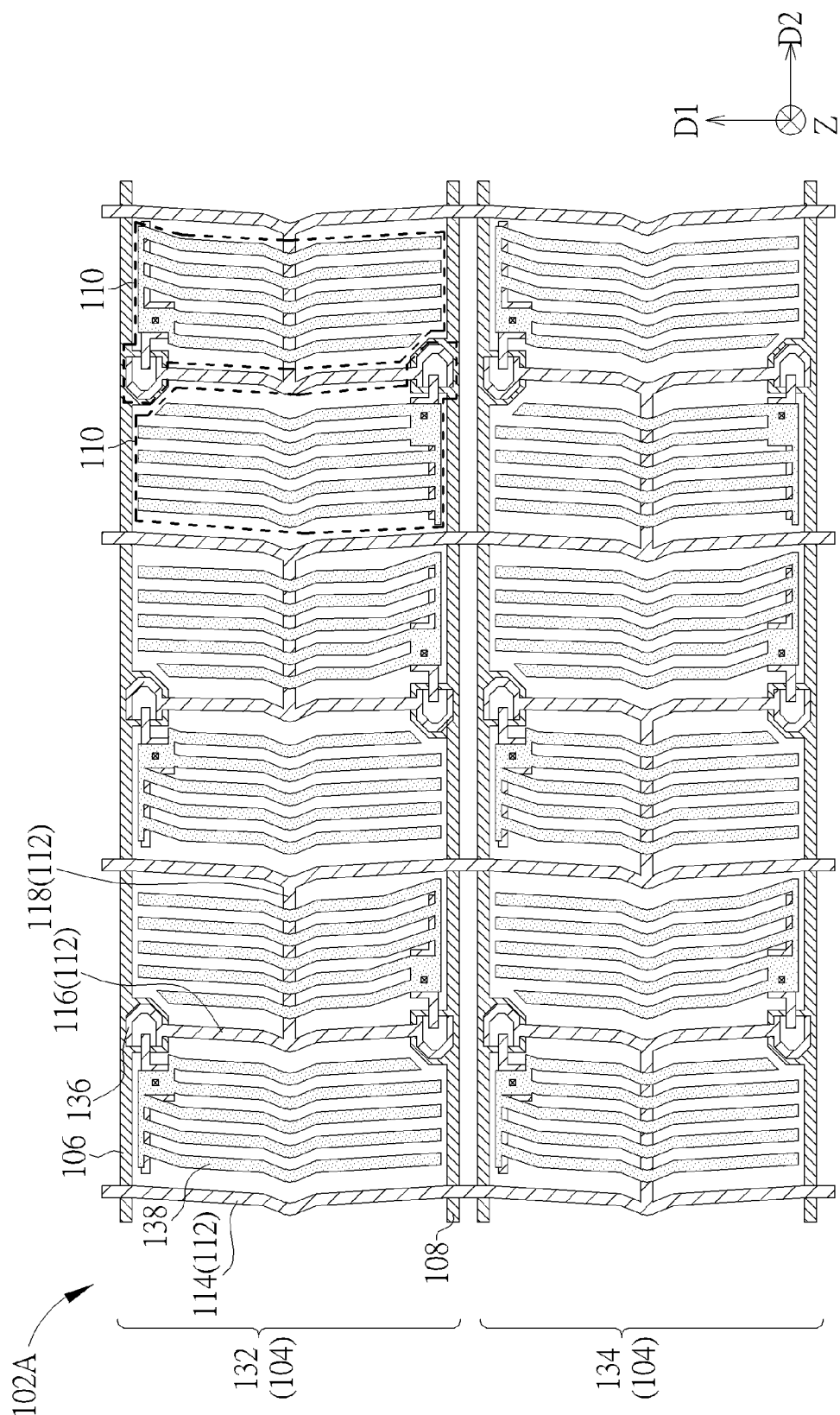
FIG. 3 is a schematic diagram illustrating a pixel array according to a variant embodiment of the first embodiment of the present disclosure.

Please refer to FIG. 3. FIG. 3 is a schematic diagram illustrating a pixel array according to a variant embodiment of the first embodiment of the present disclosure. As shown in FIG. 3, the difference between this variant embodiment and the first embodiment is that in each of the pixel rows 104 of the pixel array 102A of this variant embodiment, the gate electrodes 140 of the active switching elements 136 of $(6n-5)^{th}$ numbered sub-pixels 110, the gate electrodes 140 of the active switching elements 136 of $(6n-3)^{th}$ numbered sub-pixels 110 and the gate electrodes 140 of the active switching elements 136 of $(6n)^{th}$ numbered sub-pixels 110 are electrically connected with the first gate line 106; the gate electrodes 140 of the active switching elements 136 of $(6n-4)^{th}$ numbered sub-pixels 110, the gate electrodes 140 of the active switching elements 136 of $(6n-2)^{th}$ numbered sub-pixels 110 and the gate electrodes 140 of the active switching elements 136 of $(6n-1)^{th}$ numbered sub-pixels 110 are electrically connected with the second gate line 108, and n is a set of integers greater than 0, but not limited thereto. The other features of the pixel array 102A of this variant embodiment may be the same as the aforementioned embodiment, FIG. 1 and FIG. 2, and the identical features will not be redundantly described here.

Figure 4:
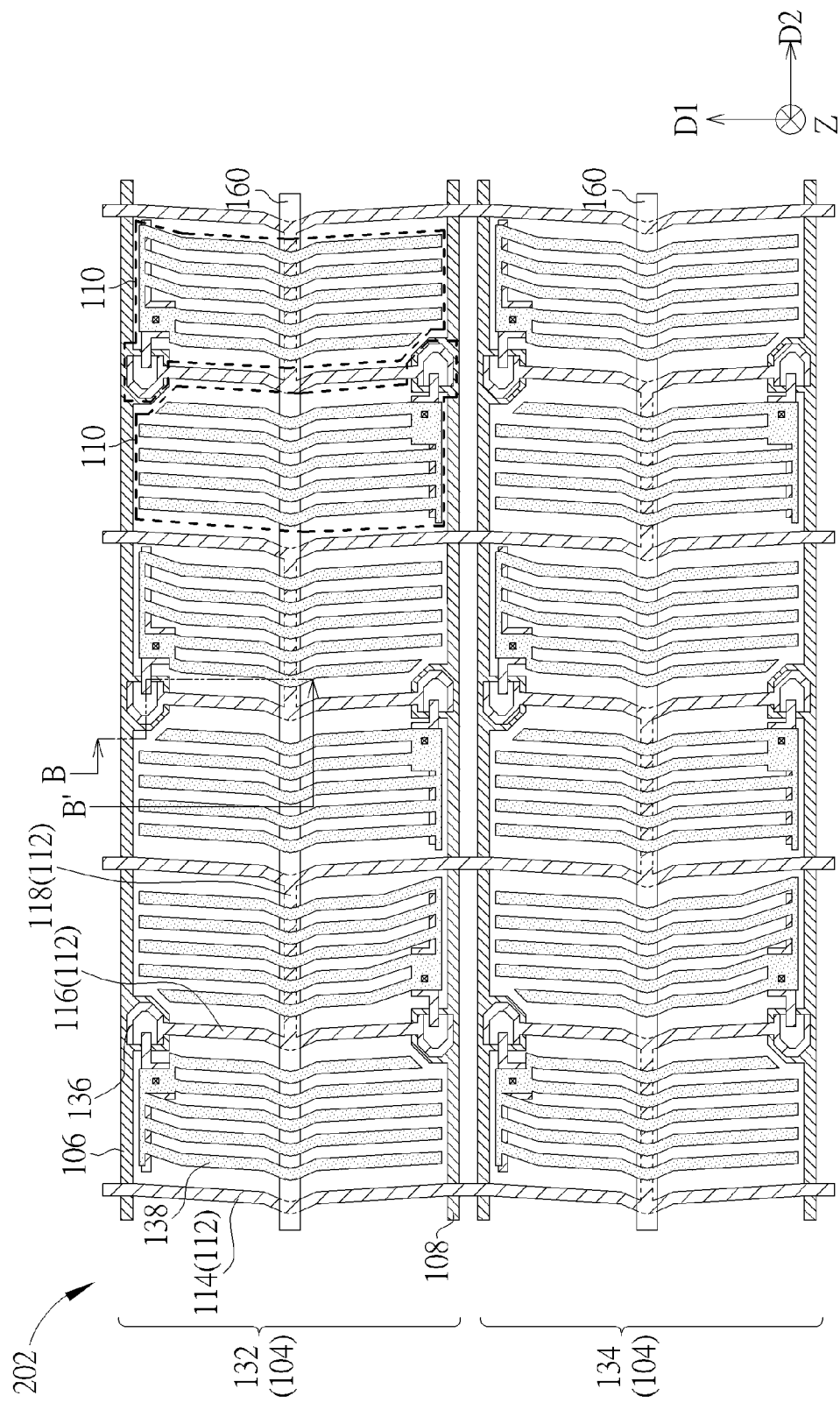
FIG. 4 is a schematic diagram illustrating a pixel array according to a second embodiment of the present disclosure.
Figure 5:
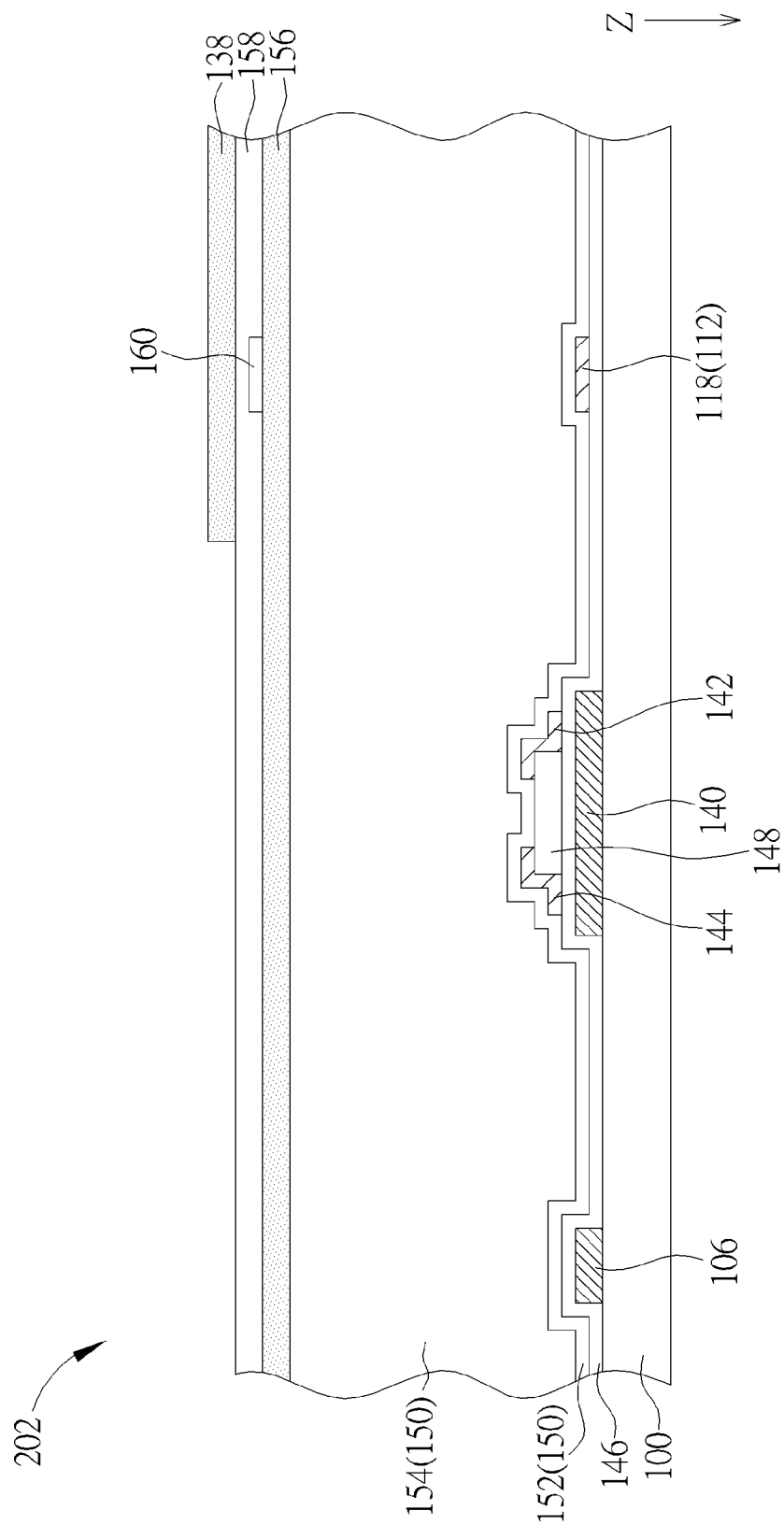
FIG. 5 is a schematic diagram illustrating a cross-sectional view of the pixel array taken along a line B-B' in FIG. 4.

Please refer to FIG. 4 and FIG. 5. FIG. 4 is a schematic diagram illustrating a pixel array according to a second embodiment of the present disclosure, and FIG. 5 is a schematic diagram illustrating a cross-sectional view of the pixel array taken along a line B-B' in FIG. 4. The difference between this embodiment and the first embodiment of the present disclosure is that each of the pixel rows 104 further includes a common line 160 disposed between the first gate line 106 and the second gate line 108. The common line 160 at least partially overlaps the connecting portions 118 of the data lines 112 in the vertical projection direction Z, and the common line 160 is electrically connected with the common electrode 156. As shown in FIG. 5, the common line 160 of this embodiment may be disposed between the common electrode 156 and the insulating layer 158, but not limited thereto. In another aspect, the common line 160 in each of the pixel rows 104 of this embodiment may be formed by a different patterned metallic layer (such as a third metallic layer) from the data line 112, the first gate line 106 and the second gate line 108, but not limited thereto. In a variant embodiment, the common line 160 may be formed by the same patterned metallic layer (such as the first metallic layer) as the first gate line 106 and the second gate line 108. In addition, the common line 160 of this embodiment at least partially overlaps the main portions 114, the branch portions 116 and the connecting portions 118 of the data lines 112 in the vertical projection direction Z. The design of the common line 160 disposed to overlap the connecting portions 118 of the data lines 112 in the vertical projection direction Z can reduce the circuit layout area between the first gate line 106 of one of the pixel rows 104 and the second gate line 108 of another one of the pixel rows 104 adjoining thereto, so as to further enhance the open ratio of the display panel effectively. The other features of the pixel array 202 of this embodiment may be the same as the first embodiment the first variant embodiment and FIGS. 1-3, and the identical features will not be redundantly described here.

Figure 6:
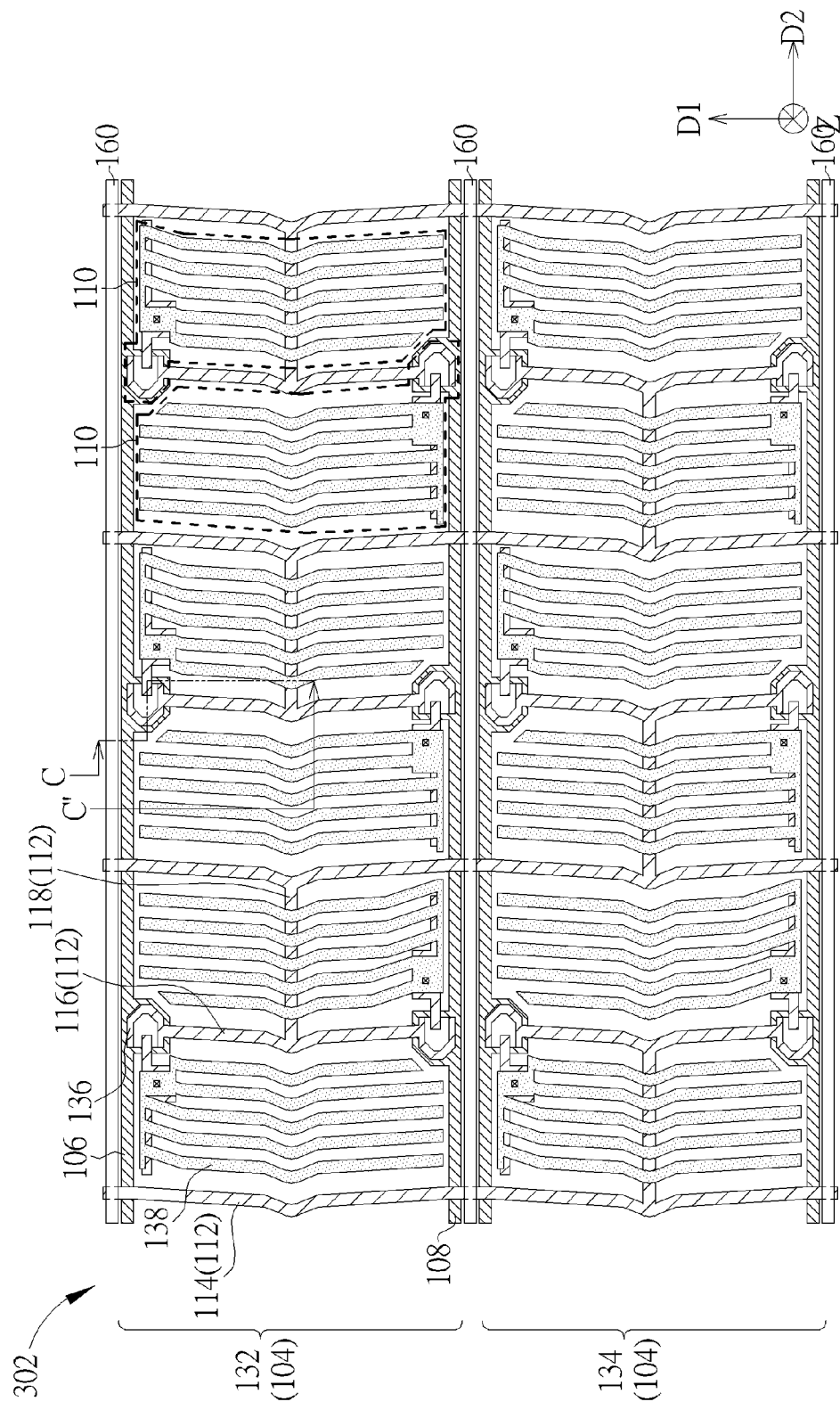
FIG. 6 is a schematic diagram illustrating a pixel array according to a third embodiment of the present disclosure.
Figure 7:
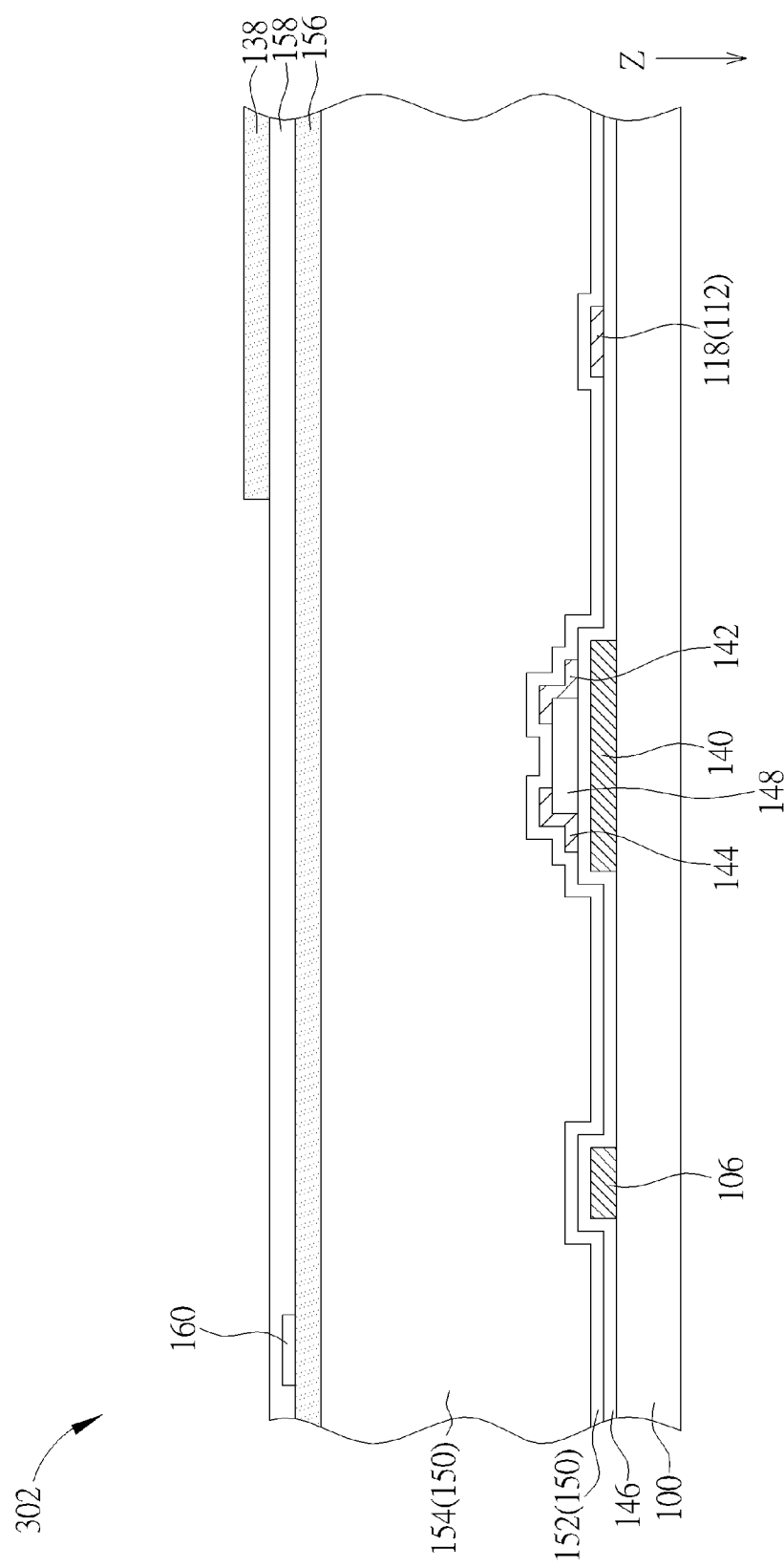
FIG. 7 is a schematic diagram illustrating a cross-sectional view of the pixel array taken along a line C-C' in FIG. 6.

Please refer to FIG. 6 and FIG. 7. FIG. 6 is a schematic diagram illustrating a pixel array according to a third embodiment of the present disclosure, and FIG. 7 is a schematic diagram illustrating a cross-sectional view of the pixel array taken along a line C-C' in FIG. 6. The difference between this embodiment and the first embodiment of the present disclosure is that the pixel array 302 further includes a plurality of common lines 160, each of the common lines 160 is disposed between the second gate line 108 of one of the pixel rows 104 and the first gate line 106 of another one of the pixel rows 104, and each of the common lines 160 is extended parallel to the first gate line 106 or the second gate line 108. In addition, the common line 160 is electrically connected with the common electrode 156. As shown in FIG. 7, the common lines 160 in the pixel array 302 of this embodiment may be disposed between the common electrode 156 and the insulating layer 158, but not limited thereto. In another aspect, the common lines 160 in the pixel array 302 of this embodiment may be formed by a different patterned metallic layer (such as a third metallic layer) from the data lines 112, the first gate lines 106 and the second gate lines 108, but not limited thereto. In a variant embodiment, the common lines 160 may be formed by the same patterned metallic layer (such as the second metallic layer) as the data lines 112. The other features of the pixel array 302 of this embodiment may be the same as the first embodiment, the first variant embodiment and FIG. 1-3, and the identical features will not be redundantly described here.

Figure 8:
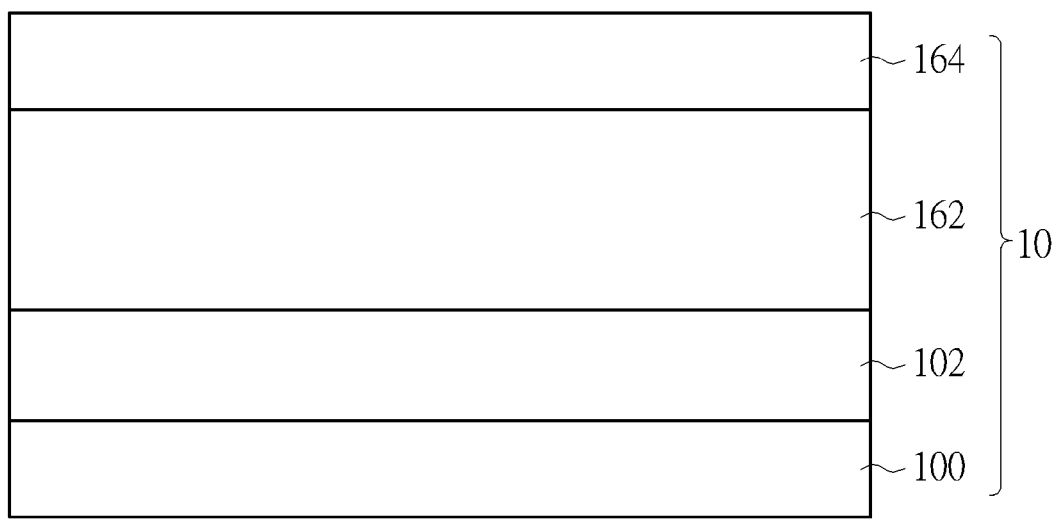
FIG. 8 is a schematic diagram illustrating a cross-sectional view of a display panel according to an embodiment of the present disclosure.

Please refer to FIG. 8. FIG. 8 is a schematic diagram illustrating a cross-sectional view of a display panel according to an embodiment of the present disclosure. As shown in FIG. 8, a display panel 10 of this embodiment includes the array substrate 100, the pixel array 102, a display medium layer 162 and a counter substrate 164. The counter substrate 164 is disposed opposite to the array substrate 100, the pixel array 102 is disposed on the array substrate 100, and the display medium layer 162 is disposed between the array substrate 100 and the counter substrate 164. The pixel array 102 of this embodiment may be any pixel array of the aforementioned embodiments. The array substrate 100 and the counter substrate 164 may include glass substrates, plastic substrates or other suitable hard substrates (namely rigid substrates or firm substrates) or other suitable flexible substrates (namely bendable substrates). The array substrate 100 may further include passive devices (such as capacitors or resistors), alignment layers or driving control circuits disposed between the display medium layer 162 and the array substrate 100. The counter substrate 164 may include a color filter or a black matrix disposed between the display medium layer 162 and the counter substrate 164, but not limited thereto. In addition, the display medium layer 162 may be a liquid crystal layer, an electrophoresis layer or an organic light emitting diode (OLED) for example, but not limited thereto. In this embodiment, the display panel 10 is a fringe field switching (FFS) liquid crystal display panel, but the present disclosure is not limited thereto. In other variant embodiments, the display panel may also be an in-plane switching (IPS) liquid crystal display panel, a twisted nematic (TN) liquid crystal display panel, a vertical alignment (VA) liquid crystal display panel or an electrical optical compensation liquid crystal display panel.

To summarize the above descriptions, in the pixel array and the display panel of the present disclosure, each of the data lines includes the main portion, the connecting portion and the branch portion. The connecting portion penetrates through the corresponding sub-pixel and is electrically connected with the main portion and the branch portion, and each of the data lines is electrically connected with the corresponding sub-pixel through the branch portion. Therefore, the issue of the conventional pixel array with the half source driver structure which the branch electrodes of the data lines require the circuit layout area between two adjoining gate lines of two adjoining pixel rows to electrically connect with the active switching elements of the corresponding sub-pixels can be solved. In addition, the pixel array and the display panel of the present disclosure can effectively reduce the circuit layout area between two adjoining gate lines of two adjoining pixel rows, and further enhance the total open ratio of the display panel effectively. Furthermore, in the pixel array and the display panel of the present disclosure, the connecting portions of the data lines can block the regions where the efficiency of the liquid crystal is low, and the total efficiency of the display panel can be further enhanced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A pixel array disposed on an array substrate, the pixel array comprising:
  a plurality of pixel rows, each of the pixel rows comprising:
    a first gate line;
    a second gate line, wherein the first gate line and the second gate line are arranged alternately along a first direction in sequence; and
    a plurality of sub-pixels disposed between the first gate line and the second gate line along a second direction, wherein a portion of the sub-pixels are electrically connected with the first gate line, and the other portion of the sub-pixels are electrically connected with the second gate line; and
  a plurality of data lines, each comprising:
    a main portion, extending continuously to overlap at least two adjoining pixel rows between a first gate line of one of the plurality of pixel rows and a second gate line of another one of the plurality of pixel rows along the first direction;
    at least one connecting portion, extending from the main portion without interrupting the main portion, disposed between the first gate line and the second gate line of the same pixel row, and electrically connected with the main portion; and
    at least one branch portion, electrically connected with the at least one connecting portion, wherein:
      main portions of the data lines are arranged along the second direction in sequence, and the main portions of the data lines intersect the first gate line and the second gate line;

branch portions and the main portions of the data lines are arranged alternately along the second direction, and each of the sub-pixels is disposed between any two of the main portion and the branch portion adjoining to each other; and the at least one connecting portion penetrates through the sub-pixel disposed between the main portion and the branch portion along the second direction.

2. The pixel array according to claim 1, wherein the pixel rows comprise a first pixel row and a second pixel row, a first plurality of connecting portions of the data lines penetrate only even-numbered sub-pixels of a plurality of sub-pixels of the first pixel row, and a second plurality of connecting portions of the data lines penetrate only odd-numbered sub-pixels of a plurality of sub-pixels of the second pixel row.

3. The pixel array according to claim 1, wherein each of the sub-pixels comprises an active switching device and a pixel electrode, the active switching device comprises a gate electrode, a drain electrode and a source electrode, and the pixel electrode is electrically connected with the drain electrode of the active switching device.

4. The pixel array according to claim 3, wherein in each of the pixel rows, gate electrodes of active switching devices of $(6n-5)^{th}$ numbered sub-pixels of the plurality of sub-pixels, gate electrodes of active switching devices of $(6n-2)^{th}$ numbered sub-pixels of the plurality of sub-pixels, and gate electrodes of active switching devices of $(6n)^{th}$ numbered sub-pixels of the plurality of sub-pixels are electrically connected with the first gate line; and gate electrodes of active switching devices of $(6n-4)^{th}$ numbered sub-pixels of the plurality of sub-pixels, gate electrodes of active switching devices of $(6n-3)^{th}$ numbered sub-pixels of the plurality of sub-pixels, and gate electrodes of active switching devices of $(6n-1)^{th}$ numbered sub-pixels of the plurality of sub-pixels are electrically connected with the second gate line, and n is a set of integers greater than 0.

5. The pixel array according to claim 4, wherein the at least one branch portion is electrically connected with source electrodes of active switching devices of two sub-pixels of the plurality of sub-pixels respectively adjoining to the at least one branch portion in the second direction.

6. The pixel array according to claim 1, further comprising a passivation layer, an insulating layer and a common electrode disposed on the array substrate, wherein the common electrode is disposed on the passivation layer, each of the sub-pixels comprises a pixel electrode, the pixel electrode is disposed on the common electrode, and the insulating layer is disposed between the common electrode and the pixel electrode.

7. The pixel array according to claim 6, wherein each of the pixel rows further comprises a common line disposed between the first gate line and the second gate line, the common line at least partially overlaps connecting portions of the data lines in a vertical projection direction, and the common line is electrically connected with the common electrode.

8. The pixel array according to claim 7, wherein the common line is disposed between the insulating layer and the common electrode.

9. The pixel array according to claim 6, further comprising a plurality of common lines, wherein each of the common lines is disposed between a second gate line of one of the pixel rows and a first gate line of another pixel row adjoining thereto, and the common lines are electrically connected with the common electrode.

10. The pixel array according to claim 9, wherein the common lines are disposed between the insulating layer and the common electrode.

11. A display panel, comprising:
the pixel array according to claim 1;
a counter substrate disposed opposite to the array substrate; and
a display medium layer disposed between the array substrate and the counter substrate.

12. The pixel array according to claim 1, wherein the at least one connecting portion comprises a first connecting portion and a second connecting portion, the first connecting portion is disposed in a first area of the pixel array, the second connecting portion is disposed in a second area of the pixel array, and the main portion is disposed between the first area and the second area.

13. The pixel array according to claim 12, wherein the at least one branch portion comprises a first branch portion and a second branch portion correspondingly connected to the first connecting portion and the second connecting portion, respectively, and a first extending direction of the first connecting portion from the main portion to the first branch portion is opposite to a second extending direction of the second connecting portion from the main portion to the second branch portion.

14. The pixel array according to claim 1, wherein each of the sub-pixels comprises a pixel electrode having a V-shaped portion, and the at least one connecting portion overlaps a vertex of the V-shaped portion.

15. A pixel array disposed on an array substrate, the pixel array comprising:
a plurality of pixel rows, each of the pixel rows comprising:
a first gate line;
a second gate line, wherein the first gate line and the second gate line are arranged alternately along a first direction in sequence;
a plurality of sub-pixels disposed between the first gate line and the second gate line along a second direction, each comprising:
an active switching device, comprising a gate electrode, a drain electrode and a source electrode; and
a pixel electrode, electrically connected with the drain electrode of the active switching device, wherein a portion of the sub-pixels are electrically connected with the first gate line, and the other portion of the sub-pixels are electrically connected with the second gate line; and
a plurality of data lines, each comprising a main portion, a branch portion and a connecting portion, wherein:
main portions of the data lines are arranged along the second direction in sequence, and the main portions of the data lines intersect the first gate line and the second gate line;
branch portions and the main portions of the data lines are arranged alternately along the second direction, and each of the sub-pixels is disposed between any two of the main portion and the branch portion adjoining to each other; and
the connecting portion of each of the data lines is disposed between the first gate line and the second gate line, the connecting portion of each of the data lines is electrically connected with the main portion and the branch portion, and the connecting portion of each of the data lines penetrates through the sub-pixel disposed between the main portion and the branch portion along the second direction, wherein in each of the pixel rows, gate electrodes of active switching devices of $(6n-5)^{th}$ numbered sub-pixels of the plurality of sub-pixels, gate electrodes of active switching devices of $(6n-2)^{th}$ numbered sub-pixels of the plurality of sub-pixels, and gate electrodes of active switching devices of $(6n)^{th}$ numbered sub-pixels of the plurality of sub-pixels are electrically connected with the first gate line, gate electrodes of active switching devices of $(6n-4)^{th}$ numbered sub-pixels of the plurality of sub-pixels, gate electrodes of active switching devices of $(6n-3)^{th}$ numbered sub-pixels of the plurality of sub-pixels, and gate electrodes of active switching devices of $(6n-1)^{th}$ numbered sub-pixels of the plurality of sub-pixels are electrically connected with the second gate line, and n is a set of integers greater than 0.

16. A pixel array disposed on an array substrate, the pixel array comprising:

a passivation layer;

a common electrode disposed on the passivation layer;

a plurality of pixel rows, each of the pixel rows comprising:

a first gate line;

a second gate line, wherein the first gate line and the second gate line are arranged alternately along a first direction in sequence;

a plurality of sub-pixels disposed between the first gate line and the second gate line along a second direction, each comprising a pixel electrode disposed on the common electrode, wherein a portion of the sub-pixels are electrically connected with the first gate line, and the other portion of the sub-pixels are electrically connected with the second gate line; and a plurality of data lines, each comprising a main portion, a branch portion and a connecting portion; and an insulating layer disposed between the common electrode and pixel electrodes of the sub-pixels, wherein:

main portions of the data lines are arranged along the second direction in sequence, and the main portions of the data lines intersect the first gate line and the second gate line;

branch portions and the main portions of the data lines are arranged alternately along the second direction, and each of the sub-pixels is disposed between any two of the main portion and the branch portion adjoining to each other; and the connecting portion of each of the data lines is disposed between the first gate line and the second gate line, the connecting portion of each of the data lines is electrically connected with the main portion and the branch portion, and the connecting portion of each of the data lines penetrates through the sub-pixel disposed between the main portion and the branch portion along the second direction.

* * * * *